United States Patent
Saijo et al.

(10) Patent No.: US 9,374,913 B2
(45) Date of Patent: Jun. 21, 2016

(54) PRETREATMENT AGENT FOR ELECTROLESS PLATING, AND PRETREATMENT AND PRODUCTION OF PRINTED WIRING BOARD USING SAME

(71) Applicant: C. Uyemura & Co., Ltd, Osaka (JP)

(72) Inventors: Yoshikazu Saijo, Osaka (JP); Hisamitsu Yamamoto, Osaka (JP); Masayuki Utsumi, Osaka (JP); Takuya Okamachi, Osaka (JP); Takuya Komeda, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 14/478,332

(22) Filed: Sep. 5, 2014

(65) Prior Publication Data

US 2015/0072070 A1   Mar. 12, 2015

(30) Foreign Application Priority Data

Sep. 9, 2013 (JP) .................................. 2013-186687
May 16, 2014 (JP) .................................. 2014-102712

(51) Int. Cl.
*C23C 18/16* (2006.01)
*C23C 18/20* (2006.01)
*H05K 3/18* (2006.01)
*H05K 3/38* (2006.01)

(52) U.S. Cl.
CPC ............... *H05K 3/381* (2013.01); *C23C 18/16* (2013.01); *H05K 3/181* (2013.01); *H05K 2203/0776* (2013.01); *H05K 2203/0783* (2013.01); *H05K 2203/0789* (2013.01)

(58) Field of Classification Search
CPC .... C23C 18/16; C23C 18/2066; H05K 3/181; H05K 3/381; H05K 2203/0776; H05K 2203/0783; H05K 2203/0789
USPC ......................................... 106/1.11; 427/98.6
See application file for complete search history.

(56) References Cited

U.S. PATENT DOCUMENTS

| | | | | |
|---|---|---|---|---|
| 4,515,829 A | * | 5/1985 | Deckert | H05K 3/381 427/98.1 |
| 4,891,069 A | * | 1/1990 | Holtzman | C25D 5/54 106/1.12 |
| 5,250,105 A | * | 10/1993 | Gomes | C23C 18/30 106/1.11 |
| 8,796,374 B2 | * | 8/2014 | Yoshida | C23C 18/2006 524/428 |
| 2005/0014667 A1 | * | 1/2005 | Aoyama | C11D 7/08 510/175 |
| 2010/0120962 A1 | | 5/2010 | Yoshida | |
| 2011/0214994 A1 | * | 9/2011 | Utsumi | C25D 5/34 205/211 |
| 2011/0259373 A1 | | 10/2011 | Hotta et al. | |

FOREIGN PATENT DOCUMENTS

| | | |
|---|---|---|
| JP | 2009-270174 | 11/2009 |
| JP | 2010-106337 | 5/2010 |
| JP | 2011-228517 | 11/2011 |

OTHER PUBLICATIONS

DEQUEST 2000 information sheet from Italmatch Chemicals; no date available.*

* cited by examiner

*Primary Examiner* — Helene Klemanski
(74) *Attorney, Agent, or Firm* — Wenderoth, Lind & Ponack, L.L.P.

(57) ABSTRACT

A pretreatment agent for electroless plating is provided, which includes: a fluorine compound; a surfactant; and at least one solvent selected from ethylene-based glycol butyl ethers of formula: $C_4H_9-(OC_2H_4)_m-OH$ where m is an integer of 1 to 4, and propylene-based glycol butyl ethers of formula: $C_4H_9-(OC_3H_6)_n-OH$ where n is an integer of 1 to 4. Also provided are a method for pretreating a substrate to be used for a printed wiring board, and a process for producing a printed wiring board, both of which include using a pretreatment agent for electroless plating as described above.

4 Claims, No Drawings

PRETREATMENT AGENT FOR ELECTROLESS PLATING, AND PRETREATMENT AND PRODUCTION OF PRINTED WIRING BOARD USING SAME

BACKGROUND OF THE INVENTION

1. Field of the Invention

The present invention relates to a pretreatment agent for electroless plating, and a method for pretreating a substrate to be used for a printed wiring board using the same, and a process for producing a printed wiring board using the same. The pretreatment agent for electroless plating of the present invention is preferably used, in particular, as a pretreatment agent of a substrate to be used for a printed wiring board, which contains a silica-based filler in an insulating resin, before performing electroless plating on the surface of the substrate to produce a printed wiring board.

2. Description of the Related Art

The printed wiring boards widely used in the electronics and other fields may often be produced by any of the additive methods using electroless plating. The additive methods are roughly classified into full-additive methods in which wiring is formed by only electroless plating and semi-additive methods in which wiring is formed by electroless plating and subsequent electroplating. More specifically, the surface of an insulating resin substrate is roughened and then provided with a catalyst, followed by electroless plating such as electroless copper plating (the steps so far are called as a full-additive method), and if necessary, subsequent electroplating such as electrolytic copper plating (the steps so far are called as a semi-additive method), thereby forming a printed wiring board. The insulating resin may often contain a silica-based filler, so that the insulating resin can have improved mechanical and electrical characteristics and at the same time the anchor effect in the roughening treatment enhances adhesion between an insulating resin substrate and a plating film. However, there has arisen the problem of a decrease in the adhesion to the plating film as the surface roughness (anchor irregularities) of an insulating resin substrate becomes small with high functionalization and high integration of printed wiring boards.

Under the above circumstances, for example, Japanese Patent Laid-open Publication No. 2010-106337 (hereinafter referred to as Patent Document 1) discloses a conditioner as a pretreatment solution for electroless plating, which is used for treating the surface of a substrate to be used for a printed wiring board and which contains a cationic polymer (or a cationic surfactant), a nonionic surfactant, and ammonium hydrogendifluoride in water. Patent Document 1 above shows, in the section of "Examples", that when an insulating resin substrate is dipped into a conditioner having the above composition, followed by electroless plating and electrolytic copper plating, peeling strength between an underlying resin and a plating film becomes high to enhance adhesion between the resin substrate and the plating film. The conditioner can also be applied to substrates for printed wiring boards, having fine penetrating holes called "through holes" and fine non-penetrating holes called "blind via holes", and a photograph is also disclosed, in which the adhesion property of copper plating is satisfactory in the inner portions of through holes.

Japanese Patent Laid-open Publication No. 2009-270174 (hereinafter referred to as Patent Document 2) also discloses an etching treatment solution containing a fluorine compound such as hydrogen fluoride as a pretreatment solution for electroless plating, which is used to produce a printed wiring board from an insulating resin substrate containing a silica-based filler in an insulating resin. As demonstrated in Patent Document 2, the use of a fluorine compound-containing treatment solution as described above makes it possible to achieve high adhesion between a treated substrate and a plating film even for substrates having small surface roughness.

BRIEF SUMMARY OF THE INVENTION

The pretreatment solution for electroless plating, which is used for treating the surface of a substrate to be used for a printed wiring board may usually contain a surfactant. In general, surfactants have highly foaming property and are easily formable. If the foams generated during the treatment are adsorbed onto the surface of a substrate or into holes such as though holes and blind via holes, the adhesion property of metal plating is deteriorated in the subsequent electroless plating and other steps, resulting in a deterioration of plating property.

The pretreatment solution for electroless plating is further required to have high penetrability into insulating resin substrates. This is because if the pretreatment solution has low penetrability into insulating resin substrates, some chemical solutions used in various steps cannot enter into holes such as though holes and blind via holes, resulting in that the adhesion property of plating is deteriorated in the holes. In general, surfactants are considered to have the action of enhancing penetrability against substrates. However, according to the results of the present inventors' experiment, it was found that surfactants do not have enough penetrability into insulating resin substrates.

As described above, pretreatment solutions for electroless plating are strongly required to have low foaming property during treatment (foaming resistance) and high penetrability into insulating resin substrates, in addition to the property of attaining high adhesion between insulating resin substrates and plating films. Patent Documents 1 and 2 above are, however, completely silent on the evaluation of these requirements. The present inventors have performed foaming property test and penetrability test for pretreatment solutions simulated according to Patent Documents 1 and 2 above, and found that these simulated pretreatment solutions have strong foaming property and low penetrability.

Under these circumstances, the present invention has been made to provide a novel pretreatment agent for electroless plating, which can attain high adhesion between insulating resin substrates and plating films, which can suppress the generation of foams in a short time to have high foaming resistance, and which can exhibit high penetrability into insulating resin substrates. The present invention is further intended to provide a method for pretreating the surface of a substrate to be used for a printed wiring board, which contains a silica-based filler in an insulating resin, and a process for producing a printed wiring board as described above.

The pretreatment agent for electroless plating of the present invention, which can solve the above problem, comprises: a fluorine compound; a surfactant; and at least one solvent selected from ethylene-based glycol butyl ethers of formula:

where m is an integer of 1 to 4, and propylene-based glycol butyl ethers of formula:

where n is an integer of 1 to 4.

In a preferred embodiment of the present invention, the above pretreatment agent for electroless plating comprises: a fluorine compound; a surfactant; and an ethylene-based glycol butyl ether of formula:

$$C_4H_9\text{—}(OC_2H_4)_m\text{—}OH$$

where m is an integer of 1 to 4.

In a preferred embodiment of the present invention, the above pretreatment agent for electroless plating may preferably have a pH of 3.1 or lower.

The method for pretreating a substrate to be used for a printed wiring board according to the present invention, which can solve the above problem, comprises treating the surface of a substrate to be used for a printed wiring board, which contains a silica-based filler in an insulating resin, with a pretreatment agent for electroless agent as described above.

The process for producing a printed wiring board according to the present invention, which can solve the above problem, comprises: treating the surface of a substrate to be sued for a printed wiring board, which contains a silica-based filler in an insulating resin, with a pretreatment agent for electroless plating as described above, and then performing electroless plating.

According to the present invention, a pretreatment agent for electroless plating can be provided, which has excellent foaming resistance and penetrability as well as which enables excellent adhesion between an insulating resin substrate and a plating film. The adsorption of foams onto the surface of an insulating resin substrate or into the inside of a though hole, a blind via hole, and any other hole can be prevented by the enhancement of foaming resistance before it happens, thereby improving the adhesion property of plating. As a result, productivity can also be enhanced. In addition, the pretreatment agent can sufficiently penetrate the roughened surface of an insulating resin substrate because of its enhanced penetrability, thereby enhancing the addition effect of pretreatment agent. The pretreatment agent of the present invention is particularly used, in particular, for treating the surface of a substrate to be used for a printed wiring board, which contains a silica-based filler in an insulating resin. The pretreatment agent of the present invention can also be applied to the surface treatment of a substrate having though holes, blind via holes, and any other holes, which is to be used for a printed wiring board.

DETAILED DESCRIPTION OF THE INVENTION

To provide a pretreatment agent for electroless plating, excellent in all of adhesion between insulating resin substrates and plating films, foaming resistance, and penetrability into insulating resin substrates, the present inventors made studies on the basis of the fluorine compound-containing treatment solutions disclosed in Patent Documents 1 and 2 above. As a result, they have found that the fluorine compound-containing treatment solutions disclosed in these Patent Documents are excellent in adhesion to plating films, but poor in both foaming resistance and penetrability. Thus, to enhance foaming resistance and penetrability in the fluorine compound-containing treatment solutions, they have made further studies. As a result, they have found that the addition of a prescribed glycol ether, i.e., at least one of the ethylene-based glycol butyl ethers of formula: $C_4H_9\text{—}(OC_2H_4)_m\text{—}OH$ where m is an integer of 1 to 4, and the propylene-based glycol butyl ethers of formula: $C_4H_9\text{—}(OC_3H_6)_n\text{—}OH$ where n is an integer of 1 to 4, to the above fluorine compound-containing treatment solutions makes it possible to enhance both foaming resistance and penetrability, thereby attaining the intended purpose and completing the present invention. The ethylene- or propylene-based glycol butyl ether to be used in the present invention may hereinafter be abbreviated as the glycol butyl ether.

In the present invention, the pretreatment agent for electroless plating means a treatment agent to be used before electroless plating. More particularly, taking an insulating resin substrate to be used for a printed wiring board, as an example, it means a treatment agent to be used after the insulating resin substrate is subjected to swelling treatment, roughening treatment, and, if necessary, neutralization treatment for reducing oxides generated in the roughening treatment, but before the insulating resin substrate is subjected to electroless plating treatment, and it has usually been referred to as a conditioner. The insulating resin may contain a silica-based filler. In addition, the insulating resin substrate may holes such as though holes and blind via holes. It has been confirmed that even when any insulating resin substrate is used, the desired characteristics, i.e., adhesion strength, foaming resistance, and penetrability, can be obtained. The pretreatment agent or solution for electroless plating according to the present invention may hereinafter be referred to simply as the pretreatment agent or solution.

As described above, the pretreatment agent for electroless plating according to the present invention contains at least one fluorine compound; at least one surfactant; and at least one of the ethylene-based glycol butyl ether of formula:

$$C_4H_9\text{—}(OC_2H_4)_m\text{—}OH$$

where m is an integer of 1 to 4, and the propylene-based glycol butyl ether of formula:

$$C_4H_9\text{—}(OC_3H_6)_n\text{—}OH$$

where n is an integer of 1 to 4. More particularly, the pretreatment agent of the present invention is a mixture obtained by addition of water and a pH adjuster to the above components.

First, the following will describe the glycol ether that best characterizes the present invention. The glycol ether is one of the organic solvents, and has been used, for example, as a solvent for paint or ink. The glycol ether may include, for example, the ethylene glycol type (E.O. type) based on ethylene glycol, the propylene glycol type (P.O. type) based on propylene glycol, and other types. The present inventors have found for the first time that particular glycol ethers each having a butyl group substituted for one of the terminal hydrogen atoms, more specifically, the ethylene-based glycol butyl ether of formula (1):

$$C_4H_9\text{—}(OC_2H_4)_m\text{—}OH \qquad (1)$$

where m is an integer of 1 to 4, and the propylene-based glycol butyl ether of following formula (2):

$$C_4H_9\text{—}(OC_3H_6)_n\text{—}OH \qquad (2)$$

where n is an integer of 1 to 4, in the glycol ethers of the E.O. type and the P.O. type, have both foaming resistance action and penetration action.

More specifically, as demonstrated in working examples below, the use of any other glycol ether than the glycol butyl ethers of formulas (1) and (2) above did not enable the pretreatment agent to have all the desired characteristics. For example, comparative examples, each using a glycol ether of the E.O. type not having butyl group but methyl or another group, e.g., ethylene glycol dimethyl ether, diethylene glycol dimethyl ether, triethylene glycol methyl ether, triethylene glycol ethyl ether, or triethylene glycol dimethyl ether, are superior in foaming resistance, but are inferior in penetrability (see Nos. 14 to 18 in Table 1 below). Similarly, comparative examples, each using a glycol ether of the P.O. type not having butyl group but methyl group, e.g., dipropylene glycol dimethyl ether or dipropylene glycol monomethyl ether, are excellent in foaming resistance, but poor in penetrability (see Nos. 19 and 20 in Table 1 below). Among these, for example, the penetrability of Nos. 15 to 19 was as low as 2 minutes or longer.

In contrast, when a glycol butyl ether as specified in the present invention was used, penetrability was drastically enhanced, and, for example, the penetrability of Nos. 1 and 3 to 5 (working examples) improved to one second or shorter. It follows that a reduction effect was achieved to $1/120$ or higher as compared with the above comparative examples. It has not been known so far that only particular glycol butyl ethers as specified in the present invention among other glycol ethers can have extremely excellent penetrability improvement action.

Thus, the present invention is one having technical significance in that only glycol butyl ethers of formulas (1) and (2), in particular, among other glycol ethers have remarkable penetrability enhancement action as well as foaming resistance, while effectively exhibiting high adhesion strength of a fluorine compound-containing pretreatment solution, and the present invention is to be recognized as a so-called selection invention.

As the ethylene-based glycol butyl ether of formula (1), there can be mentioned ethylene glycol butyl ether (m=1), diethylene glycol butyl ether (m=2), triethylene glycol butyl ether (m=3), and tetraethylene glycol butyl ether (m=4). As the propylene-based glycol butyl ether of formula (2), there can be mentioned propylene glycol butyl ether (n=1), dipropylene glycol butyl ether (n=2), tripropylene glycol butyl ether (n=3), and tetrapropylene glycol butyl ether (n=4).

The term "butyl" as used in the glycol butyl ethers of formulas (1) and (2) may have a linear or branched chain structure.

Taking into consideration, for example, a further enhancement in penetrability, the glycol butyl ether may preferably be ethylene-based glycol butyl ethers of formula (1), more preferably diethylene glycol butyl ethers such as diethylene glycol mono-n-butyl ethers.

In the present invention, glycol butyl ethers of formulas (1) and (2) may be used alone or in combination. As examples of combined use, there can be mentioned examples of using two or more glycol butyl ethers of formula (1), examples of using two or more glycol butyl ethers of formula (2), and examples of using at least one glycol butyl ether of formula (1) and at least one glycol butyl ether of formula (2).

If the total amount of fluorine compound, surfactant, ethylene- or propylene-based glycol butyl ether, water, and pH adjuster is defined as the "whole amount of pretreatment agent", the amount of glycol butyl ether contained (this amount means the amount of only one glycol butyl ether contained, when the only one glycol butyl ether is contained in the pretreatment agent, or the total amount of two or more glycol butyl ethers contained, when the two or more glycol butyl ethers are contained in the pretreatment agent), relative to the whole amount of pretreatment agent, may preferably be 0.1 g/L to 500 g/L, more preferably 10 g/L to 300 g/L. When the amount of glycol butyl ether is smaller than the above lower limit, the addition effect of glycol butyl ether is not effectively exhibited, thereby lowing foaming resistance or penetrability. On the other hand, even if a glycol butyl ether is added beyond the above upper limit, the addition effect of glycol butyl ether is saturated, thereby becoming wasteful from an economical point of view.

The foregoing description was made for the glycol butyl ether that best characterizes the pretreatment agent of the present invention.

The pretreatment agent of the present invention further comprises a fluorine compound and a surfactant.

As the fluorine compound to be used in the present invention, there can be mentioned, for example, acidic sodium fluoride, acidic ammonium fluoride, ammonium hydrogen difluoride as disclosed in Patent Document 1 above, and fluorine compounds as disclosed in Patent Document 2 above (e.g., hydrogen fluoride; hydrofluoboric acid; sodium salts such as sodium fluoride and sodium hydrogen fluoride; and ammonium salts such as ammonium hydrogen fluoride, ammonium hexafluorosilicate, and ammonium hexafluorophosphate). These fluorine compounds may be added alone, or two or more of them may be used in combination.

The fluorine compound is useful for the enhancement of adhesion strength between an insulating resin substrate and a paling film. The fluorine compound preferably used in the present invention is acidic sodium fluoride or acidic ammonium fluoride, in which more preferred is acidic ammonium fluoride.

The amount of fluorine compound contained in the pretreatment solution (this amount means the amount of only one fluorine compound contained, when the only one fluorine compound is contained in the pretreatment solution, or the total amount of two or more fluorine compounds contained, when the two or more fluorine compounds are contained in the pretreatment solution) may preferably be from 0.01 g/L to 100 g/L, more preferably from 1 g/L to 50 g/L, relative to the total amount of pretreatment solution. When the amount of fluorine compound is below the lower limit, the addition effect of fluorine compound is not effectively exhibited, resulting in the lowering of adhesion strength. On the other hand, even if a fluorine compound is added in an amount beyond the upper limit, the addition effect of fluorine compound is saturated, thereby becoming wasteful from an economical point of view.

The type of surfactant to be used in the present invention is not particularly limited, but non-ionic surfactants and ionic surfactants can be used. These surfactants may be added alone, or two or more of them may be used in combination.

The non-ionic surfactants are useful as the surface tension reducing agent of the pretreatment agent. When a cationic surfactant is used as an additional surfactant, the non-ionic surfactant further exhibits the action as a dispersant of the cationic surfactant. Preferred examples of the non-ionic surfactant may include polyoxyethylene alkyl ether; and polyoxyethylene alkyl phenyl ethers such as polyoxyethylene octyl phenyl ether and polyoxyethylene nonyl phenyl ether. These non-ionic surfactants may be added alone, or two or more of them may be used in combination.

The ionic surfactants include cationic surfactants, anionic surfactants, and ampholytic surfactants, all of which can be used in the present invention.

Among these, the cationic surfactants have the action of neutralizing electric charges by being adsorbed onto the surface of a negatively charged insulating resin substrate. Preferred cationic surfactants are poly(diallyl dimethyl ammonium chloride), copolymers of poly(diallyl dimethyl ammonium chloride) and acrylamide, and polyethyleneimine.

The anionic surfactants have the action of neutralizing electric charges by being adsorbed onto the surface of a positively charged insulating resin substrate. As the anionic surfactant, those disclosed in Japanese Patent Laid-open Publication No. 2011-228517 can be used.

The ampholytic surfactants show the nature of anionic surfactants in an alkaline region and the nature of cationic surfactants in an acidic region. As described below, the pretreatment solution of the present invention may preferably indicate acidity of pH 3.1 or below, and therefore, it exhibits the nature of cationic surfactants by the use of ampholytic surfactants. As the ampholytic surfactants, those disclosed in Japanese Patent Laid-open Publication No. 2011-228517 can be used.

In the present invention, the amount of the surfactant contained in the pretreatment agent (when only one surfactant is contained, it means the amount of this surfactant, or when two or more surfactants are contained, it means the total amount of these surfactants) may preferably be from 0.1 g/L to 500 g/L, more preferably from 1 g/L to 100 g/L, based on the whole amount of pretreatment agent. When the amount of surfactant is below the above lower limit, the addition effect of surfactant is not effectively exhibited, deteriorating the precipitation properties of an electroless Cu plating film onto a glass. On the other hand, even if a surfactant is added beyond the above upper limit, the addition effect of surfactant is saturated, becoming wasteful from an economical point of view.

The forgoing has described in detail the components constituting the pretreatment agent of the present invention.

The presentment agent of the present invention may preferably have a pH of 3.1 or lower, more preferably 3.0 or lower. When it has a pH of higher than 3.1, adhesion strength between an insulating resin substrate and a plating film is lowered.

The pretreatment agent of the present invention may preferably have a pH as prescribed above, which pH is controlled by adding water to the above components and then adding a pH adjuster thereto. The pH adjuster is not particularly limited, so long as it can adjust the pH to the above acidic region. For example, sulfuric acid may preferably be used.

In the present invention, the amount of the pH adjuster contained in the pretreatment agent, based on the whole amount of the pretreatment agent, may appropriately be controlled according to the composition of the pretreatment agent so that the pretreatment agent can have a preferred pH. The amount of the pH adjuster may preferably be from 0.1 g/L to 100 g/L, more preferably from 0.5 g/L to 50 g/L. When the amount of the pH adjuster is smaller than the above lower limit, a prescribed pH cannot be obtained, deteriorating adhesion strength between an insulating resin substrate and a plating film. On the other hand, even when the amount of the pH adjuster is added in an amount beyond the above upper limit, pH lowering action is saturated, becoming wasteful from an economical point of view.

The foregoing has described the pretreatment agent of the present invention.

The pretreatment agent of the present invention may preferably be used as, but not limited to, a pretreatment agent in the production of a printed wiring board. More specifically, it may be used as a pretreatment agent, for example, in the production of a high density multilayer wiring board by a build-up construction method or a multilayer wiring board such as a wafer level CSP (Chip Size epoxy Package or Chip Scale epoxy Package) or TCP (Tape Carrier Package).

The following will describe the method for pretreatment of a substrate to be used for a printed wiring board according to the present invention. The pretreatment method of the present invention comprises treating the surface of a substrate to be used for a printed wiring board, which contains a silica-based filler in an insulating resin, with a pretreatment agent for electroless plating as described above.

The pretreatment method of the present invention is characterized by the use of a pretreatment agent for electroless plating as described above, and the method of treating the surface of a substrate to be used for a printed wiring board, which contains a silica-based filler, is not particularly limited. The pretreatment method of the present invention will hereinafter be described. For details, reference can be made, for example, to the method disclosed in Patent Document 2 described above.

First, an insulating resin substrate is prepared. The insulating resin to be used in the present invention is not particularly limited, so long as it is a resin that cannot easily be dissolved in a solution to be used in the subsequent desmear treatment to remove a smear (resin residue) generated in laser pierce processing or drill boring processing, or in the silica-based filler etching treatment. As such an insulating resin, the following resins can be mentioned, in addition to epoxy resins widely used as electrically insulating resins, imide resins, phenol formaldehyde resins, novolac resins, melamine resins, polyphenylene ether resins, bismaleimide-triazine resins, siloxane resins, maleimide resins, polyether ether ketone resins, polyether imide resins, and polyether sulfone resins. These insulating resins may be used alone or in combination. For example, use can be made of a resin obtained by mixing two or more of the above insulating resins at an arbitrary ratio.

The insulating resin substrate is then subjected to swelling treatment. The swelling treatment is performed to make the substrate surface easily roughened during roughening treatment in the later step. The method of swelling treatment is not particularly limited, but the insulating resin substrate may be dipped into a conventional swelling treatment agent for a prescribed time. As the swelling treatment agent, there can be mentioned, for example, N-methyl-2-pyrrolidone, N,N-dimethylacetamide, N,N-dimethyl formamide, and γ-butyrolactone. These swelling treatment agents can be used alone or in combination. The dipping for swelling treatment may preferably be performed, for example, at a temperature of about 60° C. to 90° C. for about 10 to 30 minutes.

After the swelling treatment, the insulating resin substrate is washed with water, and the resin surface is roughened with an etchant. As the etchant, there can preferably be used, for example, aqueous sodium permanganate solution, aqueous potassium permanganate solution, aqueous sodium chromate solution, and aqueous potassium chromate solution. These etchants can be used alone or in combination.

Then, if necessary, the residue that remains on the surface of the insulating resin substrate after the roughening treatment may be dissolved away for removal. The residue does not always remain on the substrate surface, but, for example, when aqueous sodium permanganate solution or aqueous potassium permanganate solution is used as the etchant, manganese oxide derived from the etchant remains on the substrate surface. Therefore, the insulating resin substrate may preferably be dipped into a reducing treatment solution to make the substrate surface clean for the purpose of removing the oxide by reduction, neutralization, and dissolution. As the reducing treatment solution, there can preferably be used, for example, a reducing treatment solution containing one reducing agent, or two or more reducing agents, such as hydroxylamine sulfate, sodium hypophosphite, aminoborane, dimethylaminoborane, hydrosulfite, and formalin. The dipping in the reducing treatment solution may preferably be performed, for example, at a temperature of about 20° C. to 90° C. for about 5 to 30 minutes.

The insulating resin substrate pretreated as described above is subjected to electroless plating, and if necessary, further electroplating. These plating processes will be described below in detail. The pretreatment agent of the present invention is used before electroless plating, after swelling treatment and subsequent roughening treatment, and if necessary, further reducing treatment, are performed as described above. More particularly, when reducing treatment is not performed, the pretreatment agent of the present invention is used after roughening treatment; or when reducing treatment is performed, the pretreatment agent of the present invention is used simultaneously with or after the reducing treatment. For example, when the pretreatment agent of the present invention is used simultaneously with reducing treatment, a treatment agent may preferably be used, which agent is prepared by mixing a reducing agent as described above with a fluorine compound, a surfactant, and a glycol butyl ether, all of which constitute the pretreatment agent of the present invention, followed by addition of water and a pH adjuster to adjust the pH in a range of, for example, from 1 to 4.

The following will describe a process for producing a printed wiring board according to the present invention. The producing process of the present invention comprises treating the surface of a silica-based filler-containing insulating resin substrate to be used for a printed wiring board, with a pretreatment agent for electroless plating as described above, and then performing electroless plating. If necessary, electroplating may be performed thereafter.

The producing process of the present invention has a feature that use is made of a pretreatment agent for electroless plating as described above according to the present invention. Regarding a method of treating the surface of a silica-based filler-containing substrate to be used for a printed wiring board, and a method of subsequent electroless plating, although there is no particular limitation, reference can be made, for example, to the methods disclosed in Patent Document 2 described above. Among these, the surface treatment method of a substrate to be used for a printed wiring board has been described in the above, and the following will describe an electroless plating method.

The electroless plating method is a plating method using no current, in contrast to an electroplating method using an external current. The electroless plating method is roughly classified into a displacement plating method (also referred to as an immersion plating method), in which a metal material to be plated is immersed into a plating solution, and a reduction plating method (also referred to as a chemical plating method), utilizing a chemical reduction reaction. The electroless plating to be used in the production of a printed wiring board is a reduction plating method.

First, before electroless plating is performed, the insulating resin substrate, of which surface has been treated by the above method, is subjected to cleaning treatment. This makes dirt, oil, etc., removed from the surface of the insulating resin substrate. In addition, wettability is improved to further enhance the adhesion strength between the insulating resin substrate and the plating film. The cleaning treatment is not particularly limited, but the insulating resin substrate may be dipped into a solution available in a conventional cleaning treatment for a prescribed time.

The surface of the substrate is then slightly roughened (softly etched) with an etchant such as an aqueous solution of sulfuric acid or sodium persulfate, and the residue remaining on the surface is removed with a pickling solution such as an aqueous sulfuric acid solution.

A catalyst metal as the core of electroless plating is then formed (adsorbed) on the surface of the insulating resin substrate. The method of forming a catalyst metal is not particularly limited, but it may include, for example, dipping the insulating resin substrate into a catalyst metal-containing solution for a prescribed time. As the catalyst metal, there can be mentioned, for example, Pd (e.g., $Pd^{2+}$) and Sn (e.g., $Sn^{2+}$), which can be derived from a catalyst metal source such as palladium chloride (e.g., $PdCl_2$-$2H_2O$) and stannous chloride (e.g., $SnCl_2$—$2H_2O$), respectively. These catalyst metal sources can be used alone or in combination (of which typical example is a Pd—Sn complex). The catalyst solution may be prepared by a method in which hydrochloric acid (HCl) is added to a catalyst metal source, followed by addition of water. The catalyst solution may preferably have a concentration of, for example, 100 to 300 mg/L as the Pd concentration, 10 to 20 g/L as the Sn concentration, and 150 to 250 mL/L as the HCl concentration. More specifically, the insulating resin substrate is put into the catalyst solution having a concentration as describe above and dipping treatment is performed at a temperature of 30° C. to 40° C. for 1 to 3 minutes to make a Pd—Sn colloid adsorbed on the surface of the insulating resin substrate.

The insulating resin substrate, on which surface is adsorbed with the catalyst metal as described above, is dipped into an accelerator-containing solution to activate the catalyst metal. This activation treatment provides the removal of, for example, Sn from the Pd—Sn complex, resulting in the formation and adsorption of metal Pd on the substrate surface. Finally, this metal Pd serves as a catalyst to accelerate the deposition of plating metal (typically, Cu) in the subsequent electroless plating. As the accelerator, there can be mentioned, for example, sulfuric acid, hydrochloric acid, sodium hydroxide, and ammonia solutions. These solutions may preferably have a concentration in a range of, for example, 50 to 100 mL/L. The dipping condition may preferably be at room temperature (i.e., 20° C. to 25° C.) for about 1 to 5 minutes.

In forming the catalyst metal, pretreatment may be performed using various solutions, such as predip, activator, and reducer, before using an accelerator as described above. This results in a further enhancement of adhesion strength between an insulating resin substrate and a plating film. In addition, the wettability of the catalyst onto the surface of the insulting resin substrate becomes more favorable. For various solutions as described above, use can be made of well-known ones, or commercially available products may also be used.

The formation of a catalyst metal as described above may be followed, if necessary, by the formation of a plating resist pattern to mask other portions than a part to be deposited with a plating film, which plating resist pattern is intended to form a prescribed circuit pattern on a substrate to be used for a printed wiring board. The resist pattern may be removed, after plating treatment, by etching treatment or the like, or the resist pattern may be used as a solder resist without being removed after plating treatment. The method of forming a plating resist pattern is not particularly limited, but well-known methods can be used.

A plating film is then formed by an electroless plating method to form a circuit pattern. The insulating resin substrate may be dipped into a well-known treatment solution before performing electroless plating, so that the catalyst adhered onto the surface of the insulting resin substrate is reduced for activation to accelerate the deposition of a plating metal. As the treatment solution, there can be mentioned, for example, 10% sulfuric acid solution and reducer. As the reducer, use can be made of well-known ones, or commercially available products may also be used.

The electroless plating method is not particularly limited, but the insulating resin substrate may be dipped into an electroless plating bath. As the electroless plating bath, there can be mentioned, for example, a copper plating bath containing a complexing agent such as EDTA or Rochelle salt. The composition of the electroless plating bath is not particularly limited, but as one example of the composition of an EDTA-containing electroless copper plating bath, there can be mentioned, for example, one containing 10 g/L of copper sulfate and 30 g/L of EDTA and being adjusted to a pH of 12.5 with sodium hydroxide. The dipping into an electroless plating bath may preferably be performed under a condition of, for example, a temperature of 60° to 80° C. for 30 to 600 minutes. When a substrate having blind via or other holes to be used for a multilayer wiring board, a plating solution may preferably be stirred sufficiently for a full supply of copper ions into the blind via during electroless plating. The stirring method is not particularly limited, but there can be used, for example, air stirring or any other stirring such as pump circulation.

In the electroless plating treatment, two-step plating may be performed to further enhance the adhesion between the insulting resin substrate and the plating film. More specifically, primary plating treatment to form an underlying plating film on an insulating resin substrate is first performed, and then, a secondary plating treatment to form a thick plating film, of which thickness becomes thicker than the underlying plating film, on the underlying plating film may be performed to form a circuit pattern.

A desired printed wiring board is thus obtained, but if necessary, electroplating may be performed after the electroless plating. The method of electroplating is not particularly limited, but well-known methods can be used. In addition, cleaning with a cleaner or the like, and pickling, may be performed before the electroplating. These methods are also not particularly limited.

The present application claims the benefit of priorities from Japanese Patent Application No. 2013-186687, filed on Sep. 9, 2013, and Japanese Patent Application No. 2014-102712, filed on May 16, 2014, both the entire contents of which are incorporated herein by reference.

EXAMPLES

The present invention will hereinafter be described more specifically by way of Examples, but the present invention is not limited to the following Examples. The present invention can be put into practice after appropriate modifications or variations within a range meeting the gist described above and below, all of which are included in the technical scope of the present invention.

Example 1

In this Example, various pretreatment solutions were used, which were prepared to contain components shown in Table 1 and adjusted to pH3.0 by addition of sulfuric acid (5 g/L) as a pH adjuster and water. In Table 1, the fluorine compound means acidic ammonium fluoride available from Kishida Chemical Co., Ltd., the nonionic surfactant means NYMEEN S220 available from NOF Corporation, and the cationic surfactant means FPA1001L available from Senka Corporation. The fluorine compound had a concentration of 5 g/L in all cases, and all the surfactants had a concentration of 4 g/L regardless of type.

With regard to various pretreatment solutions described above, penetrability and foaming resistance were evaluated as follows.

(Evaluation of Penetrability)

In this Example, the pretreatment solutions were evaluated for penetrability by a felt precipitation method. For the purpose of penetrability evaluation, cut pieces of felt (JA 3t available from Yoneshima Felt Co., Ltd.) were prepared in size of 20 mm height, 20 mm width, and 3 mm thickness.

First, 100 mL of each of various pretreatment solutions was poured into a 100 mL beaker, and heated to the pretreatment temperature (40° C.) as shown in Table 2 below. Then, one felt cut piece was dropped from the position 20 to 30 mm higher than the surface of the pretreatment solution, and time required for the felt cut piece to come in contact with the surface of the pretreatment solution and leave the surface of the pretreatment solution (start to settle) was measured. The felt cut piece will settle when the pretreatment solution penetrates the felt cut piece, so that the pretreatment solution exhibiting shorter time is evaluated as having more excellent penetrability.

(Evaluation of Foaming Resistance)

In this Example, the pretreatment solutions were evaluated for foaming resistance by a shaking method.

First, 20 mL of each of various pretreatment solutions described above was poured into a 100 mL stopper-equipped measuring cylinder, and heated to the treatment temperature (40° C.) as shown in Table 2 below. The measuring cylinder was then closed with the stopper, and shaken vertically 10 times, after which the stopper was opened, and the height of bubbles from the solution surface ($H_{t=0min}$) was measured just after the stopper opening (at t=0 min.). The measuring cylinder was left standing for three minutes, and time (in seconds) until the bubbles were varnished was measured. The pretreatment solution exhibiting shorter time until bubbles are varnished is evaluated as having more excellent foaming resistance. In this regard, when the bubbles were not varnished even after left standing for three minutes, the height of bubbles from the solution surface ($H_{t=3min}$) was measured after left standing for three minutes (at t=3 min.), and its difference ($=H_{t=0min}-H_{t=3min}$, i.e., the height of bubbles remaining without being varnished) was calculated.

Further, the following samples were prepared for the purpose of measuring adhesion strength between a plating film and an insulating resin substrate.

First, insulating resin substrates each having a glass epoxy substrate (FR-4 as the NEMA symbol) and a resin film (ABF-GXT31 available from Ajinomoto Fine-Techno Co., Inc.) layered on the glass-epoxy substrate were swollen, surface roughened, neutralized with a reducing solution, and dried in the procedures as shown in Table 2, followed by treatment with various pretreatment solutions as shown in Table 1. Then, the insulating resin substrates were softly etched, pickled, and provided with a Pd catalyst by the catalyst imparting process (predip, activator, and reducer), followed by electroless copper plating and drying to form a plating film of 1 μm in thickness. Further, the plated substrates were dried, heat treated, cleaned, and pickled, followed by electrolytic copper plating under the condition of 2.5 A/dm$^2$ to form a copper plating film of 25 μm in thickness. The plated substrates were then subjected to discoloration preventive treatment, drying, and heat treatment to prepare the samples.

The samples thus prepared were measured for adhesion strength between a plating film and an insulating resin substrate as follows.

(Measurement of Adhesion Strength Between Plating Film and Insulating Resin Substrate)

A cut of 1 cm in width was made in each of the above samples, followed by 90° peel test according to the method as described in JIS-C5012, "8.5 Plating Adhesion", to measure peel strength with Autograph AGS-X Series Precision Universal Tester available from Shimadzu Corporation.

The results are shown in Table 1.

TABLE 1

| Test No. | Pretreatment solution - Glycol ether Classification | Pretreatment solution - Glycol ether Type | Concentration | Fluorine compound | Type of surfactant | Evaluation - Penetrability Felt settling method | Evaluation - Foaming resistance Shaking method | Evaluation - Adhesion Peel strength |
|---|---|---|---|---|---|---|---|---|
| 1 | Ethylene glycol types | Ethylene glycol mono-n-butyl ether | 100 g/L | Contained | Nonionic | ≤1 sec. | 14 sec. | 660 gf/cm |
| 2 | | Diethylene glycol mono-n-butyl ether | 10 g/L | Contained | Nonionic | 8 sec. | 20 sec. | 675 gf/cm |
| 3 | | Diethylene glycol mono-n-butyl ether | 100 g/L | Contained | Nonionic | ≤1 sec. | 15 sec. | 680 gf/cm |
| 4 | | Diethylene glycol mono-n-butyl ether | 100 g/L | Contained | Cationic | ≤1 sec. | 17 sec. | 680 gf/cm |
| 5 | | Diethylene glycol mono-n-butyl ether | 300 g/L | Contained | Nonionic | ≤1 sec. | 15 sec. | 690 gf/cm |
| 6 | | Triethylene glycol mono-n-butyl ether | 100 g/L | Contained | Nonionic | 4 sec. | 16 sec. | 670 gf/cm |
| 7 | | Tetraethylene glycol mono-n-butyl ether | 100 g/L | Contained | Nonionic | 5 sec. | 18 sec. | 650 gf/cm |
| 8 | Propylene glycol types | Propylene glycol mono-n-butyl ether | 100 g/L | Contained | Nonionic | 3 sec. | 16 sec. | 675 gf/cm |
| 9 | | Dipropylene glycol mono-n-butyl ether | 100 g/L | Contained | Nonionic | 3 sec. | 17 sec. | 671 gf/cm |
| 10 | | Tripropylene glycol mono-n-butyl ether | 100 g/L | Contained | Nonionic | 4 sec. | 17 sec. | 664 gf/cm |
| 11 | | Tetrapropylene glycol mono-n-butyl ether | 100 g/L | Contained | Nonionic | 6 sec. | 19 sec. | 654 gf/cm |
| 12 | | — | — | Not contained | Nonionic | ≥2 min. | 75 mm (Foam remaining) | 630 gf/cm |
| 13 | Ethylene glycol types | Diethylene glycol mono-n-butyl ether | 100 g/L | Contained | Nonionic | ≤1 sec. | 15 sec. | 350 gf/cm |
| 14 | | Ethylene glycol dimethyl ether | 100 g/L | Contained | Nonionic | 1 min. and 40 sec. | 18 sec. | 669 gf/cm |
| 15 | | Diethylene glycol dimethyl ether | 100 g/L | Contained | Nonionic | ≥2 min. | 18 sec. | 665 gf/cm |
| 16 | | Triethylene glycol methyl ether | 100 g/L | Contained | Nonionic | ≥2 min. | 18 sec. | 672 gf/cm |
| 17 | | Triethylene glycol ethyl ether | 100 g/L | Contained | Nonionic | ≥2 min. | 18 sec. | 682 gf/cm |
| 18 | | Triethylene glycol dimethyl ether | 100 g/L | Contained | Nonionic | ≥2 min. | 18 sec. | 659 gf/cm |
| 19 | Propylene glycol types | Dipropylene glycol monomethyl ether | 100 g/L | Contained | Nonionic | ≥2 min. | 18 sec. | 644 gf/cm |
| 20 | | Dipropylene glycol dimethyl ether | 100 g/L | Contained | Nonionic | 1 min. and 30 sec. | 17 sec. | 666 gf/cm |

TABLE 2

| Steps | | Name of chemicals | concentration | Treatment temperature (° C.) | Treatment time (min.) |
|---|---|---|---|---|---|
| Swelling | | APPDES-37 available from C. Uyemura & Co., Ltd. | 500 mL/L | 50 | 10 |
| Roughening | | MDE-40 available from C. Uyemura & Co., Ltd. | 70 mL/L | 70 | 15 |
| | | ELC-SH available from C. Uyemura & Co., Ltd. | 370 mL/L | | |
| Neutralization | | APPDES MDN-62 available from C. Uyemura & Co., Ltd. | 100 mL/L | 35 | 5 |
| Drying | | | | | |
| Pretreatment solution | | See Table 1 | | 40 | 1 |
| Soft etching | | Sodium persulfate | 100 g/L | 25 | 1 |
| | | Sulfuric acid | 100 g/L | | |
| Pickling | | Sulfuric acid | 100 g/L | 25 | 1 |
| Catalyst imparting | Predip | ALCUP MDP-2 available from C. Uyemura & Co., Ltd. | 10 mL/L | 25 | 2 |
| | | Sulfuric acid | 3 g/L | | |
| | Activator | ALCUP MAT-SP available from C. Uyemura & Co., Ltd. | 50 mL/L | 40 | 5 |
| | | 1N-NaOH | 40 mL/L | | |
| | Reducer | ALCUP MAB-4-A available from C. Uyemura & Co., Ltd. | 10 mL/L | 35 | 3 |
| | | ALCUP MAB-4-C available from C. Uyemura & Co., Ltd. | 50 mL/L | | |
| | | ALCUP MRD-2-C available from C. Uyemura & Co., Ltd. | 10 mL/L | | |
| | Accelerator | THRU-CUP MEL-3-A available from C. Uyemura & Co., Ltd. | 50 mL/L | 25 | 1 |
| Electroless copper plating | | THRU-CUP PEA-6-A available from C. Uyemura & Co., Ltd. | 100 mL/L | 36 | 15 |
| | | THRU-CUP PEA-6-B-2X available from C. Uyemura & Co., Ltd. | 50 mL/L | | |
| | | THRU-CUP PEA-6-C available from C. Uyemura & Co., Ltd. | 14 mL/L | | |

TABLE 2-continued

| Steps | Name of chemicals | concentration | Treatment temperature (° C.) | Treatment time (min.) |
|---|---|---|---|---|
| | THRU-CUP PEA-6-D available from C. Uyemura & Co., Ltd. | 15 mL/L | | |
| | THRU-CUP PEA-6-E available from C. Uyemura & Co., Ltd. | 50 mL/L | | |
| Drying | | | | |
| Heat treatment | | | 150 | 30 |
| Cleaner | THRU-CUP MSC-3-A available from C. Uyemura & Co., Ltd. | 100 mL/L | 40 | 5 |
| Pickling | Sulfuric acid | 100 g/L | 25 | 1 |
| Electrolytic copper plating | THRU-CUP ETN (2.5 A/dm$^2$) available from C. Uyemura & Co., Ltd. | | 25 | 45 (25 μm) |
| Decoloration | THRU-CUP AT-21 available from C. Uyemura & Co., Ltd. | 1 mL/L | 25 | 1 |
| Drying | | | | |
| Heat treatment | | | 190 | 60 |

The following discussion can be made from Table 1.

Test Nos. 1 to 11 are working examples using glycol butyl ethers as specified herein. In all the cases of ethylene glycol types (Nos. 1 to 7) or propylene glycol types (Nos. 8 to 11), the tested pretreatment solutions were excellent in all of penetrability, foaming resistance, and adhesion. This effect was effectively exhibited, regardless of the surfactant type (see Test Nos. 3 and 4).

On the other hand, Test Nos. 12 to 20 are comparative examples of each using a pretreatment solution failing to fulfill any of the requirements of the present invention. These comparative examples had the following problems.

Test No. 13 is a comparative example of using a pretreatment solution, which contains a glycol butyl ether as specified herein and a surfactant, but no any fluorine compound. As shown in Table 1, Test No. 13 was excellent in penetrability and foaming resistance but had significantly lowered adhesion. It is therefore understood that the addition of a fluorine compound is essential to ensure high adhesion strength against plating films.

Test No. 12 is a comparative example of using a pretreatment solution, which contains a fluorine compound and a surfactant, but no glycol butyl ether, and of simulating the treatment solution disclosed in Patent Document 1 or 2 above. As shown in Table 1, Test No. 12 was excellent in adhesion because of containing a fluorine compound, but was deteriorated in penetrability because of containing no glycol butyl ether and further deteriorated in foaming resistance because of foam remaining even after left standing for three minutes when foaming test was performed. From the results of Test Nos. 12 and 13 above, it is understood that the addition of at least one glycol butyl ether is essential to ensure penetrability and foaming resistance.

Test Nos. 14 to 20 are comparative examples of each using a pretreatment solution, which contains a fluorine compound and a surfactant, but a glycol ether other than specified herein. These comparative examples were all satisfactory in adhesion and foaming resistance, but were significantly deteriorated in penetrability. In particular, considering penetrability, these comparative examples were significantly deteriorated in penetrability as compared with Test Nos. 1 to 11 using glycol butyl ethers as specified herein.

These results have demonstrated that only glycol butyl ethers as specified herein, particularly even in glycol ethers, can enhance both penetrability and foaming resistance.

The invention claimed is:

1. A pretreatment agent for electroless plating, comprising:
   a fluorine compound; a surfactant; and at least one solvent selected from the group consisting of ethylene-based glycol butyl ethers of formula:

$C_4H_9$—$(OC_2H_4)_m$—OH where m is an integer of 1 to 4, and propylene-based glycol butyl ethers of formula:

$C_4H_9$—$(OC_3H_6)_n$—OH where n is an integer of 1 to 4,
   wherein the pretreatment agent for electroless plating has a pH of 3.1 or lower.

2. The pretreatment agent for electroless plating according to claim 1, wherein the solvent is an ethylene-based glycol butyl ether of formula:

$C_4H_9$—$(OC_2H_4)_m$—OH where m is an integer of 1 to 4.

3. A method for pretreating a substrate to be used for a printed wiring board, comprising:
   treating a surface of the substrate to be used for a printed wiring board, which contains a silica-based filler in an insulating resin, with the pretreatment agent according to claim 1.

4. A process for producing a printed wiring board, comprising:
   treating a surface of a substrate to be used for a printed wiring board, which contains a silica-based filler in an insulating resin, with the pretreatment agent for electroless plating according to claim 1; and
   then performing electroless plating.

* * * * *